United States Patent [19]

Constable et al.

[11] Patent Number: 5,001,429
[45] Date of Patent: Mar. 19, 1991

[54] REMOVAL OF TRUNCATION ARTIFACTS IN NMR IMAGING

[75] Inventors: Robert T. Constable; Ross M. Henkelman, both of Toronto, Canada

[73] Assignee: General Electric Company, Milwaukee, Wis.

[21] Appl. No.: 439,995

[22] Filed: Nov. 21, 1989

[51] Int. Cl.⁵ ............................................. G01R 33/56
[52] U.S. Cl. ..................................... 324/312; 324/307; 364/413.19
[58] Field of Search ............... 324/307, 309, 312, 311; 364/413.13, 413.16, 413.19; 382/22

[56] References Cited

U.S. PATENT DOCUMENTS 4,767,991  8/1988  Rzedzian ............................ 324/312
4,780,675  10/1988 DeMeester et al. ................ 324/312
4,912,412  3/1990  Suzuki et al. ...................... 324/312
4,950,991  8/1990  Zur ..................................... 324/312

OTHER PUBLICATIONS

*Modified Linear Prediction Modeling in Magnetic Resonance Imaging*, Joel F. Martin and Charles F. Tirendi, Journal of Magnetic Resonance 82, 392-399, (1989).
Constrained Reconstruction: *A Superresolution, Optimal Signal-to-Noise Alternative to the Fourier Transform in Magnetic Resonance Imaging*, E. Mack Haacke, Zhi-Pei Liang, Steven H. Izen, Med. Phys. 16(3), May/Jul. 1989.
*A New Algorithm in Spectral Analysis and Band-Limited Extrapolation*, Athanasios Papoulis, IEEE Trans on Circuits & Systems, vol. CAS-22, No. 9, Sep. 1975.

*Primary Examiner*—Michael J. Tokar
*Assistant Examiner*—Kevin D. O'Shea
*Attorney, Agent, or Firm*—Quarles & Brady

[57] ABSTRACT

Truncation artifacts in NMR images are reduced by splicing to the truncated data extrapolated high frequency data derived from the truncated image. The truncated data is Fourier transformed into image space and processed with an edge enhancing filter. The retransformed, filtered data yields edge derived high frequency information that may augment the truncated data. The spliced truncated data and edge enhanced data are then reconstructed into an artifact reduced image. In one embodiment, the edge enhancement is performed by iterative passes of a modified Sigma filter. The spliced data is blended with the truncated data near the regions of the splice by means of a weighted average.

12 Claims, 4 Drawing Sheets

REMOVAL OF TRUNCATION ARTIFACTS IN NMR IMAGING

BACKGROUND OF THE INVENTION

This invention relates to nuclear magnetic resonance (NMR) imaging methods and apparatus and more particularly to a method of reducing image artifacts caused by truncation of the NMR data along one or more k-space axes.

NMR has been developed as an imaging method useful in diagnostic medicine. In NMR imaging, as is understood by those skilled in the art, a body being imaged is held within a uniform magnetic field oriented along a z axis of a Cartesian coordinate system.

The net magnetizations of the nuclei of the body are excited into precession by means of a radio frequency (RF) pulse and the decaying precession of the spins produces an NMR signal. The amplitude of the NMR signal is dependant, among other factors, on the number of precessing nuclei per volume within the imaged body termed the "spin density".

Magnetic gradient fields $G_x$, $G_y$, and $G_z$ are applied along the x, y and z axis to impress position information onto the NMR signals through phase and frequency encoding. A set of NMR signals may then be "reconstructed" to produce an image. Each set of NMR signals is comprised of many "views", a view being defined as one or more NMR signal acquisitions made under the same x and y gradients fields.

One NMR image reconstruction technique, associated with "spin warp" imaging, will be described herein. It should be recognized however that the present invention may be advantageously practiced with other NMR image acquisition techniques.

Referring to FIG. 1, a typical "spin echo" pulse sequence for acquiring data under the spin warp technique includes: (1) a z-axis gradient $G_z$ activated during a first 90° RF pulse to select the image slice in the z axis, (2) a y-axis gradient field $G_y$ to phase encode the precessing nuclear spins in the y direction, and (3) an x-axis gradient $G_x$ activated during the acquisition of the NMR signal to frequency encode the precessing nuclear spins in the x direction. The time during which steps (1) and (2) are performed will be termed the "encoding interval" 11 and the time during which step 3 is performed will be termed the "acquisition interval" 13.

Two such NMR acquisitions, $S_1$ and $S_1'$, the latter inverted and summed with the first, comprise the NMR signal of a single view "A" under this sequence Note that only the y gradient field $G_y$ changes between view "A" and subsequent view "B". This pulse sequence is described in detail in U.S. Pat. No. 4,443,760, entitled: "Use of Phase Alternated RF Pulses to Eliminate Effects of Spurious Free Induction Decay Caused by Imperfect 180 Degree RF Pulses in NMR Imaging", and issued Apr. 17, 1984.

Referring to FIG. 2, the acquisition of a plurality of NMR signals to construct an image is illustrated by referring to the concept of k-space. An imaged object 10 is subject to the pulse sequence of FIG. 1. The NMR signals comprising one view provides the data elements 16 within a bounded area of k-space 12 along one "row" 14 of k-space 12 orientated along the $k_x$ axis. Each data element 16 of the row 14, is a sequential sample of the NMR waveforms produced by the pulse sequence for that view. The particular row 14 of the view is determined by the relative amplitude of $G_y$ for that NMR signal acquisition: for example, more positive gradients $G_y$ (each measured by area) will produce the NMR signals filling higher rows. The process of acquiring data to fill the rows of k-space will be termed "scanning".

During the scanning process, additional rows of the bounded k-space area 12 are filled by repeated NMR signal acquisitions at different gradients $G_y$. The data elements 16 of the k-space area 12 are then subject to a two-dimensional Fourier transform along the $k_x$ and $k_y$ axes to produce the image 18.

Within k-space, data close to the origin 20 contains the low frequency spatial components of the image 18 and data removed from the origin contains the high frequency spatial components of the image 18. It may be understood, therefore, that the dimensions of k-space correspond to the resolution of the image 18; data filling a larger area of k-space generally produces an image containing higher frequency components and hence higher spatial resolution.

While resolution of the image is important, practical limits on the scanning time, which may be on the order of several minutes per slice, require that the area of k-space filled with data be limited.

The total scanning time needed to acquire data 16 is most sensitive to the number of rows 14 of k-space data, hence the height of columns of k-space data, and less sensitive to length of each row 14 of data. The reason for this may be illustrated by referring to FIG. 1. The time required to acquire data for a k-space row 14 is the sum of the encoding interval 11 plus the acquisition interval 13 (times two for the spin echo sequence shown). Decreasing the length of a k-space row, decreases the acquisition interval 13 but not the encoding interval 11. Thus the savings of time resulting from decreasing the length of the k-space row 14 is diminished by effect of the fixed encoding interval 11.

On the other hand, decreasing the number of rows 14 of k-space data eliminates the encoding and acquisition intervals 11 and 13 associated with those rows 14 and hence has a more profound effect on the total scanning time. For this reason, it is desirable that the number of rows of k-space data acquired be limited to the number necessary for clinically acceptable resolution.

The acquisition of a reduced field of data in k-space will be termed "truncation". Referring to FIG. 3, a truncated projection 12' includes a limited number of k-space rows centered about the origin 20. In contrast to the projection set 12 shown in FIG. 2, the outer rows of k-space have not been filled. The area of these outer rows will be designated Regions 1 and 3, whereas the area of k-space in which data is acquired will be designated Region 2.

Although the reduced spatial resolution resulting from the truncation process may be acceptable, the truncation process also produces truncation artifacts. Referring to FIG. 4(a), an example non-truncated NMR signal 21 from a single column of k-space 12 is shown. The Fourier transform of the signal 21 is a step function 22, shown in FIG. 4(b), and corresponding to an "edge" 24 between light and dark areas of image 18.

Referring to FIG. 4(c), the truncation process is equivalent to multiplying the non-truncated signal 21 by a rectangular truncation function 26 which has a value of "one" for values of $k_y$ corresponding to Region 2 of FIG. 3 and values of "zero" for values of $k_y$ corresponding to Regions 1 and 3 of FIG. 3. The rectangular truncation function has a Fourier transform that is a sinc function 28, as shown in FIG. 4(d).

The image produced by the truncated data will be the Fourier transform of the product of the non-truncated data 21 and the rectangular truncation function 26. This is equivalent to the convolution of the Fourier transforms 24 and 28 as shown in FIGS. 4(b) and 4(d). The result of this convolution is shown in FIG. 4(e). The convolution 30 preserves the edge 24 of the step function 22 of FIG. 4(b) but includes ripple truncation artifacts caused by the lobes of the sinc function 28. The most prominent truncation artifact 32 is a result of the primary lobe of the sinc function 36.

As the truncation becomes more severe, i.e., the rectangular truncation function 26 becomes narrower, the truncation artifact ripples 32 become spaced further from the edge 24, but nevertheless maintain the same amplitude of approximately 9% of the height of the step function 22. In the image 18, the truncation artifacts appear as halos extending along the axis of truncation around edges 24 in the image 18.

Thus, even if the truncated projection set provides acceptable spatial resolution, the truncation may produce unacceptable truncation artifacts.

Truncation artifacts may be removed by low-pass filtering of the projection data, however, this produces a corresponding and severe loss of image resolution.

Alternatively, it has been recognized that truncation artifacts may be reduced by recreating the high frequency data removed as a result of the truncation process. Such methods currently attempt to extrapolate the high frequency data of Regions 1 and 3 through the use of linear predictive models operating directly on the data of Region 2.

SUMMARY OF THE INVENTION

In the present invention, the high frequency data lost in truncation process is recreated from the edge information contained in the image formed from the truncated data. This new high frequency data is spliced to the truncated data and the combination is reconstructed to form an image with reduced truncation artifacts.

It is one object of the invention, therefore, to reduce truncation image artifacts by restoring the high frequency image data with data derived from the edges in the image. The truncated data is Fourier transformed into a first image set and filtered with an edge sensitive filter to preferentially reduce variations in the image from image features other than edges. The image features removed by the edge sensitive filter includes some fine detail as well as noise and truncation artifacts. The filtered image is reverse Fourier transformed and the high frequency data so produced is spliced to the original truncated data.

It is yet another object of the invention to provide a method of accurately distinguishing edge information from other features of the image including noise and truncation artifacts. In one embodiment, the edge information is extracted by repeated application of a modified Sigma filter. The vertical window of the modified Sigma filter is made dependant on the magnitude of the particular image point being processed hence the relationship between the truncation artifact amplitude and edge amplitude is exploited in distinguishing such artifacts from associated image edges.

It is a further object of the invention to reduce truncation artifacts without adversely affecting the integrity of the NMR image. The original truncated data is not replaced, but rather the high frequency data derived from the edge information in the image is spliced into those regions of k-space not occupied by the original truncated data. The actual measured, rather than extrapolated, NMR data remains unaffected. In one embodiment, the extrapolated data and original data are overlapped slightly and a weighted average applied to reduce artifacts resulting from the splicing operation.

It is yet another object of the invention to provide a computationally efficient method of removing truncation artifacts. The edge filtering methods disclosed may be efficiently implemented on the computers and processors ordinary associated with NMR equipment.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

DETAILED DESCRIPTION OF THE INVENTION

Figure 1:
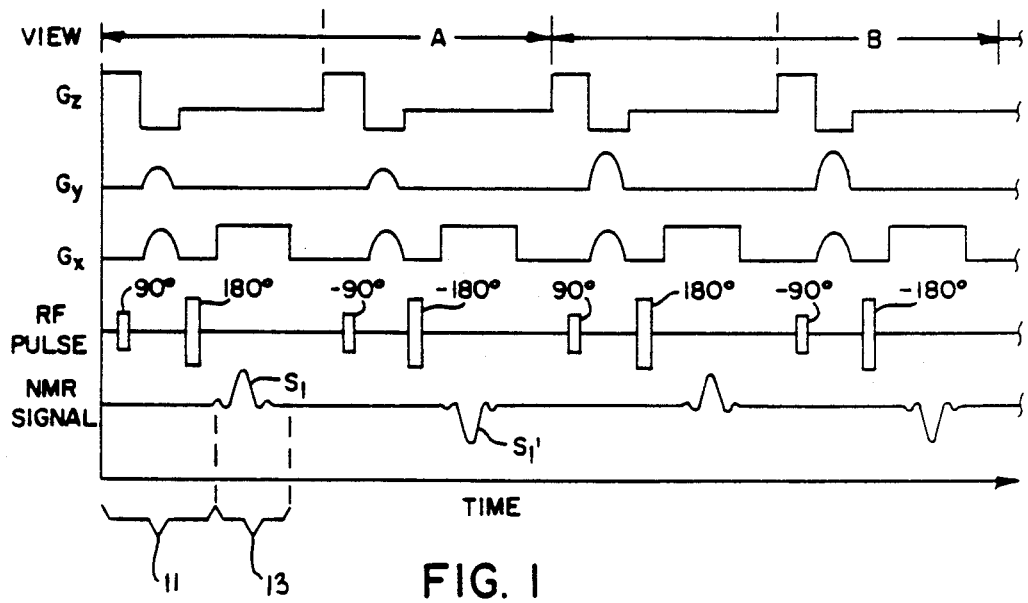
FIG. 1 is an NMR imaging pulse sequence of a type used in two-dimensional spin warp imaging and suitable for use with the present invention.
Figure 2:
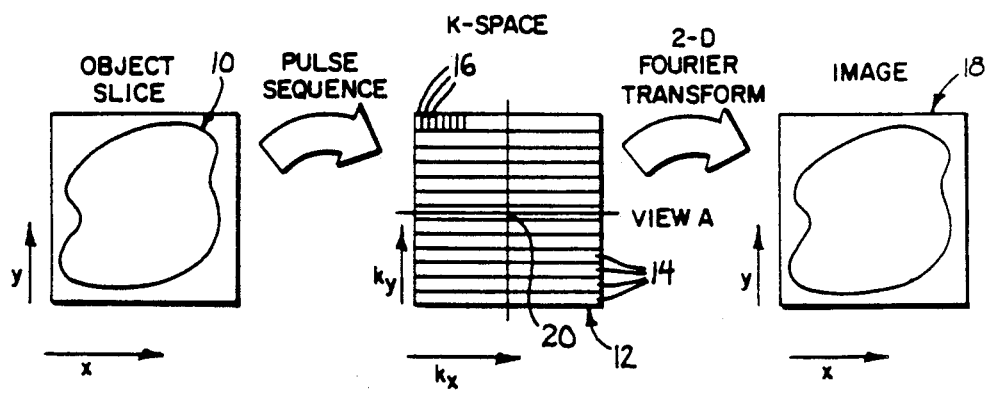
FIG. 2 is a representation of the data transformations in spin warp imaging showing the relationship of the imaged object to k-space and the final image.
Figure 5:
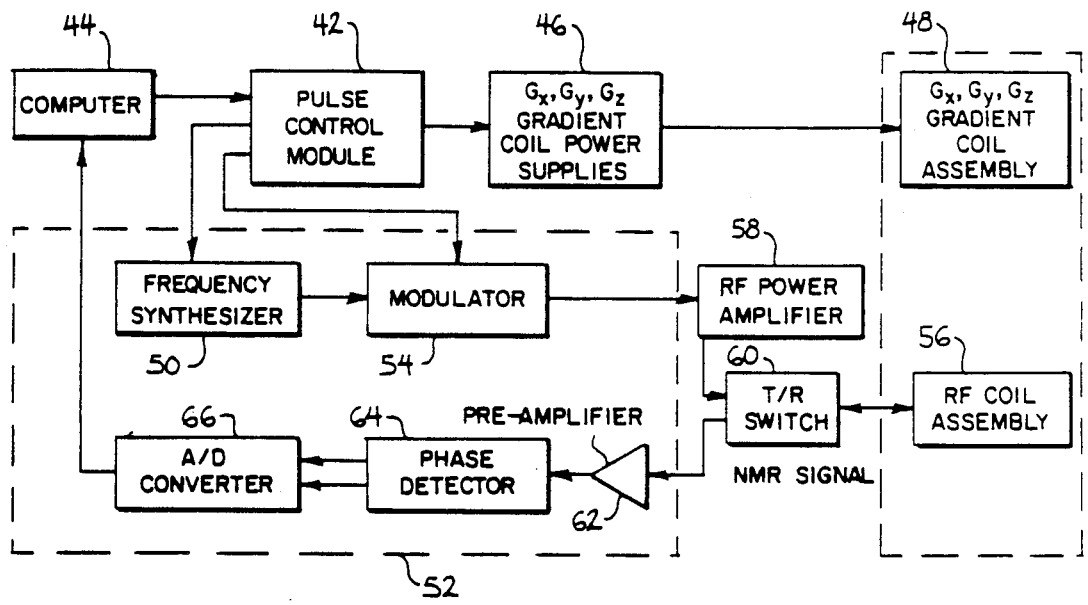
FIG. 5 is a block diagram of an NMR system incorporating a computer and suitable for carrying out the method of the invention.

Referring to FIG. 5, an NMR system generally designated 40, includes a pulse control module 42 which provides properly timed pulse sequences such as that shown in FIG. 1 for spin warp imaging, under the control of a computer 44. The pulse control module 42 controls, in turn, gradient power supplies 46 which produce the gradients $G_x$, $G_y$, and $G_z$ as described above, by means of gradient coils 48.

The pulse control module 42 also controls a radio frequency synthesizer 50 which is part of an RF transceiver system, portions of which are enclosed by dashed line block 52. The pulse control module 42 also controls a RF modulator 54 which modulates the output of the radio frequency synthesizer 50. The resultant RF signals, amplified by power amplifier 58 and applied to RF coil 56 through transmit/receive switch 60, are used to excite the nuclear spins of the imaged patient (not shown).

The NMR signals from the excited nuclei are picked up by the RF coil 56 and presented to preamplifier 62 through transmit/receive switch 60, to be amplified and then processed by a quadrature phase detector 64. The detected signals are digitized by an high speed A/D converter 66 and applied to computer 44 for processing, as will now be described, to produce NMR images of the object.

The data from the NMR signals may be stored for processing according to the present invention in a memory array corresponding to k-space 12. Referring again to FIG. 3, each NMR view maps to one row 14 of $2N'$ rows of k-space 12', each row 14 separated in the $k_y$ direction by $\Delta k_y$. $N'$ is typically 256 for present generation high quality NMR images.

A projection set truncated in the $k_y$ direction 38, only fills N consecutive rows of k-space 12' centered about the origin where $N < N'$. Successful results for the present truncation method have been obtained for N as small as 96.

The area of k-space 12' filled by data of the truncated projection set 38, previously designated Region 2, comprises rows $N/2-1$ to $N/2$. Region 1 comprises rows $N/2-1$ to $N'$, and Region 3 comprises rows $-N/2$ to $-N'$. Regions 1 and 3, containing no NMR data, are zero-filled.

Each row 14 comprises a number of data elements $s(x,y)$ separated in the $k_x$ direction by $\Delta k_x$.

Ordinarily, the truncation will only be in the phase encode or $k_y$ direction as shown, because, as mentioned before, the marginal time penalty for collecting sufficient data to avoid truncation in the $k_x$ direction is low. Accordingly, the processing of the projection set data to remove truncation artifacts need only deal with the one dimensional data strings of the columns of k-space 12'.

For reason of convenience the results of single dimensional Fourier transformations of the truncated projection set 38 along the axis of truncation will be termed generally an image, even though the two dimensional Fourier transformation necessary to produce a true image is not performed.

Figure 3:
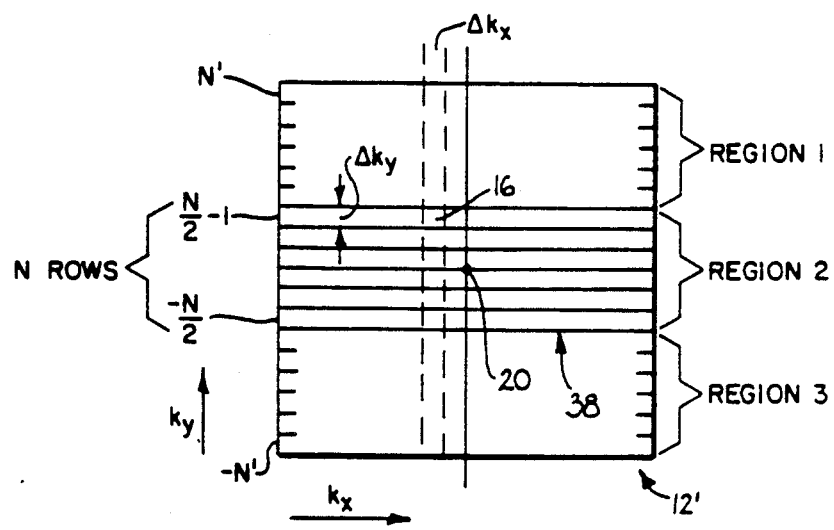
FIG. 3 is a detailed representation of k-space, similar to that shown in FIG. 2, where the data has been truncated in the $k_y$ direction.
Figure 4A:
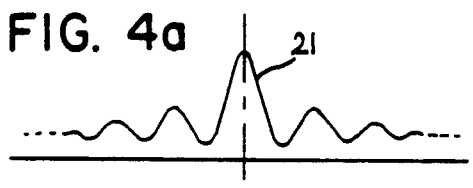
FIG. 4(a) is a plot of example data from a single column of k-space without truncation.
Figure 4B:
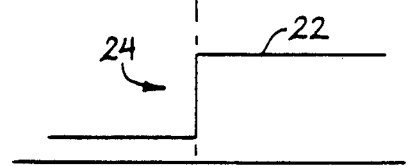
FIG. 4(b) is a plot of the magnitude of the Fourier transformation of the data of FIG. 4(a) showing an edge in the image.
Figure 4C:
FIG. 4(c) is a plot of the effective truncation function operating on the data of FIG. 4(a) when that data is truncated.
Figure 4D:
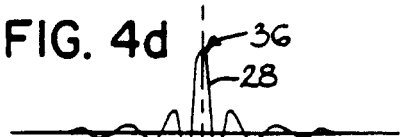
FIG. 4(d) is a plot of the magnitude of the Fourier transformation of the data of FIG. 4(c) showing a characteristic sinc function.
Figure 4E:
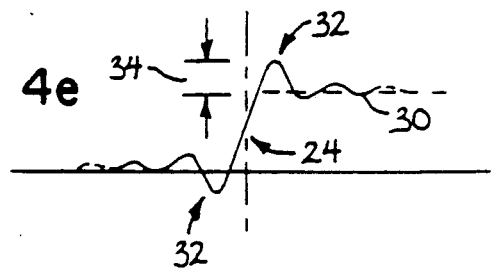
FIG. 4(e) is a plot of the convolution of the images of FIG. 4(b) and 4(d) showing the effect of the truncation function of FIG. 4(c) on the data of FIG. 4(a)

The processing of the truncated projection set 38 of FIG. 3 to remove truncation artifacts is accomplished by program routines executed on computer 44. However, as will be apparent to one of ordinary skill in the art, the functions of the program routines may be alternatively implemented as discrete hardware modules.

Figure 6:
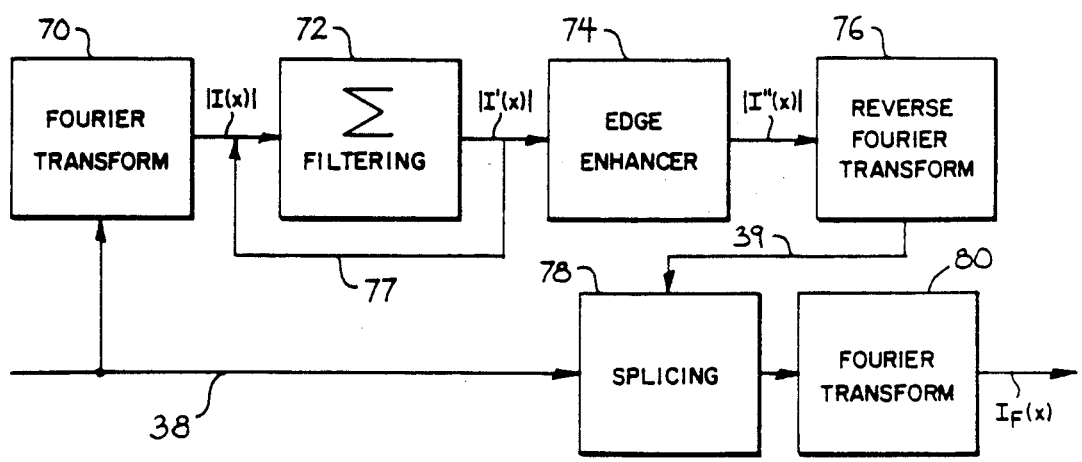
FIG. 6 is a block diagram of the computer operations, performed by the computer of FIG. 5, necessary for carrying out the method of the invention.

Referring to FIG. 6, each column of data from the truncated projection set 38 is first processed by a Fourier transform, as shown in process block 70, to produce an image signal I(x) as follows:

$$I(x) = \frac{1}{N'} \Delta k_x \sum_{m=-N'/2}^{m=(N'/2)-1} s(m\Delta k_y)e^{j2\pi m\Delta k_y x} \quad (1)$$

where:

$$s(m\Delta k_y) = \begin{cases} s(x, m\Delta k_y) & \text{for } -N/2 \leq m \leq (N/2)-1 \\ 0 & \text{for } -N'/2 \leq m \leq -N/2; \\ & (N/2)-1 \leq m \leq (N'/2)-1 \end{cases} \quad (2)$$

The magnitude of the complex valued image I(x), for each column of data is then processed by a modified Sigma filter, indicated as process block 72, to be described below, which operates to remove noise and truncation artifacts while maintaining the edge information of the magnitude of the image: $|I(x)|$.

Figures 7A, 7B, 7C:
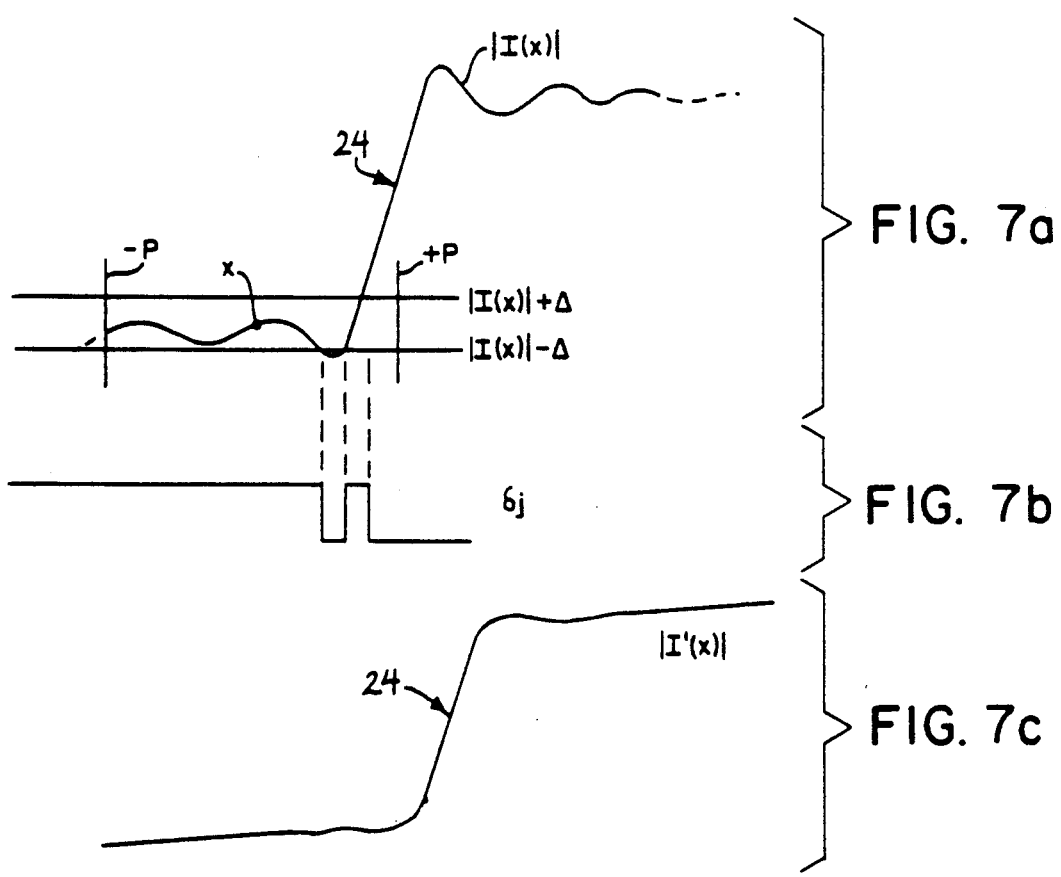
FIG. 7(a) is a example plot of image data prior to modified Sigma filtering per one embodiment of the invention.
FIG. 7(b) is a plot of δ(x) used in the modified Sigma filter and showing the basis of the modified Sigma filter's windowing and averaging.
FIG. 7(c) is a plot of the image data of FIG. 7(a) after modified Sigma filtering.

Referring to FIG. 7(a), for $|I(x)|$ near an image edge 24, a function $\delta(j)$ is defined as follows:

$$\delta(j) = \begin{cases} 1 & \text{if } |I(x)| - \Delta \leq |I(j)| \leq |I(x)| + \Delta \\ 0 & \text{otherwise} \end{cases} \quad (3)$$

As shown in FIG. 7(b), $\delta(j)$, is determined over a region of $|I(x)|$ with respect to point x, and has values of "one" only where the values of the image $|I(x)|$ are within a range of $\Delta$ about the value at point x.

Referring again to FIG. 6, the modified Sigma filter 72 produces a smoothed image $|I'(x)|$ as follows:

$$|I'(x)| = \sum_{j=-x+p}^{j=x-p} \delta j I(j) / \sum_{j=-x+p}^{j=x-p} \delta j \quad (4)$$

where p will is the modified Sigma filter window "width" and $\Delta$ is the modified Sigma filter window "height".

Referring again to FIG. 7(a) and (b), generally, the modified Sigma filter 72 smooths the waveform $|I(x)|$ by averaging the points within the width and height windows of the modified Sigma filter 72. The region of $|I(x)|$ near the edge 24 is less affected by this smoothing because the high rate of change of $|I(x)|$ near the edge 24 reduces the effective window width of the averaging process. Accordingly, the modified Sigma filter 72 reduces low amplitude variation in $|I(x)|$ while preserving edge 24 information distinguished by higher amplitudes.

The width window p is preferably set to 1 but may be varied depending on the application. Higher values of p will further reduce truncation artifacts and other low contrast features of $|I(x)|$ but at the expense of less edge 24 definition.

$\Delta$ may be set to twice the standard deviation of the image magnitude $|I(x)|$ over the entire image. In another embodiment, however, $\Delta$ is made proportional to $|I(x)|$. This variation in $\Delta$ helps preserve low amplitude image edges 24, which also have low amplitude truncation artifacts, while selectively eliminating the large truncation artifacts from large amplitude image edges 24.

Specifically, in this latter embodiment:

$$\Delta = \left( 40 \frac{|I(x)|}{|I_{max}|} + 5.0 \right) \quad (5)$$

where $I_{max}$ is the maximum image value over the truncated image. $\Delta$ thus varies between values of 5 and 45.

Referring again to FIG. 6, the modified Sigma filtering 72 is repeated to further reduce low contrast information, as shown by process path 77. In the preferred embodiment, the filtering is repeated for 5 iterations with the size of $\Delta$ decreased by an additional 40% with each iteration.

The image $|I'(x)|$ is next edge enhanced, as indicated by process block 74, by raising each data element $|I'(x)|$ to a power $\alpha$ and renormalizing the entire data set, as follows:

$$|I''(x)| = (|I'(x)|)^\alpha / c \quad (6)$$

where c is a renormalizing constant.

In the preferred embodiment $\alpha = 3/2$, although smaller and larger powers could be used. Generally, the larger powers $\alpha$ will increase edge enhancement but will tend to add sharp peaks at the edges of the resulting image whereas smaller powers will decrease the effectiveness of the truncation removal.

The inverse Fourier transformation of the edge enhanced data set is then taken as shown by process block 76:

$$s''(m\Delta k_y) = \sum_{n=-N/2}^{n=(N/2)-1} |I''(x)| e^{j2\pi m\Delta k_y n k_x} \quad (7)$$

The data $s''(m\Delta k_y)$ now contains high frequency information from the edges of the enhanced image $|I''(x)|$.

The original truncated data 38, $s(m\Delta k_y)$, lacks high frequency components as a result of the truncation, but is otherwise correct. Therefore this original truncation data 38 is preserved and the edge enhanced data 39, $s''(m\Delta k_y)$, is spliced into Regions 1 and 3 of k-space 12', as shown in FIG. 3, per process block 78 of FIG. 6. Region 2, of FIG. 3, retains the original truncated data 38.

The splicing operation creates a new data set $s'''(m\Delta k_y)$ where:

$$s'''(m\Delta k_y) = \begin{cases} s(m\Delta k_y) & \text{for } -N/2 \leq m \leq (N/2)-1 \\ s''(m\Delta k_y) & \text{for } -N'/2 \leq m \leq (-N/2); \\ & (N/2)-1 \leq m \leq (N'/2)-1 \end{cases} \quad (8)$$

In another embodiment, the data for five rows on the outer side of the junctions between Regions 1 and 2 and Regions 2 and 3, as shown in FIG. 3, are "blended" by means of a weighted average with the outer points of Region 2. That is, for the blending in Region 1:

$$s'''(m\Delta k_y) = s\left(\frac{N}{2}-1\right)\left(\frac{10-a}{10}\right) + s''(m\Delta k_y) + \left(\frac{a}{10}\right) \quad (9)$$

where $a = m - \left(\frac{N}{2}-1\right)$ and $1 \leq a \leq 10$.

-continued
and for the blending in Region 3:

$$s'''(m\Delta k_y) = s\left(-\frac{N}{2}\right)\left(\frac{10-a}{10}\right) + s''(m\Delta k_y) + \left(\frac{a}{10}\right) \quad (10)$$

where $a = -\frac{N}{2} - m$ and $1 \leq a \leq 10$.

Outside of the blending region the relation of equation (8) applies. Clearly other averaging methods including those using higher order weighting functions may be used and the number of rows 14 of each data set that are overlapped and blended may be varied as will be understood by one of ordinary skill in the art.

The data $s'''(m\Delta k_y)$ is then Gaussian filtered and Fourier transformed along the truncation axis:

$$I_F(x) = \frac{1}{N'} \Delta k_x \sum_{m=-N'/2}^{m=(N'/2)-1} s'''(m\Delta k_y) e^{j2\pi m\Delta k_y x(1-m/\sigma)^2} \quad (11)$$

where $\sigma$ is the width of the Gaussian filter and is set to 0.6 N.

$I_F(x)$ is then Fourier transformed along the axis perpendicular to the truncation axis, $k_x$, to produce the final truncation artifact reduced image.

As will be apparent from the above description, to those of ordinary skill in the art, other edge enhancing filters may be substituted for the modified Sigma filter of the preferred embodiment. For example a 1D or 2D Sigma filter or Median filter may be used with similar edge selecting effects. Also, other edge enhancing methods may be substituted for the power method herein described. For example, a comparison and select filter may be used for edge enhancement. Alternately, subtracting a fixed quantity from the magnitude signal, $|I(t)|$, and renormalizing the entire image will have the effect of edge enhancement as will other thresholding techniques.

It is important, primarily, that the edge enhancement technique not shift the location of the edge. If this happens, truncation artifacts may be enhanced rather than suppressed.

While this invention has been described with reference to particular embodiments and examples, other modifications and variations, such as application to projection reconstruction imaging techniques, will occur to those skilled in the art in view of the above teachings. Accordingly, the present invention is not limited to the preferred embodiment described herein, but is instead defined in the following claims.

We claim:

1. An apparatus for reducing truncation image artifacts resulting from the reconstruction of an NMR image from a projection set truncated along a k-space truncation axis comprising:

Fourier transform means for converting the truncated projection set into a first image set having edges;

edge sensitive filter means for preferentially reducing variations in the first image set in regions outside those regions with edges, such edge sensitive filter means operating on the first image set to produce a filtered image set;

reverse Fourier transform means for operating on the filtered image set for producing a modified projection set having high and low frequency data elements; and a splicing means for combining the truncated projection set with the modified projection set to produce a composite projection set, said composite projection set which may be reconstructed into a second image with reduced truncation artifacts.

2. The apparatus of claim 1 wherein the edge sensitive filter means comprises;

a modified Sigma filter having horizontal width p, and vertical width $\Delta$, and;

an edge enhancing means.

3. The apparatus of claim 2 wherein the value of $\Delta$ is proportional to the magnitude of the values of the first image set.

4. The apparatus of claim 2 wherein the edge enhancing means raises each value of the first image set to a power.

5. The apparatus of claim 1 wherein the splicing means combines only the high frequency data elements of the modified projection set, with the data of the truncated projection set.

6. The apparatus of claim 5 wherein the splicing means uses a weighted average to blend the data between the truncated projection set and the modified projection set.

7. A method of removing image artifacts resulting from truncation of the NMR projection set comprising the steps of:

Fourier transforming the truncated projection set to produce a first image set;

filtering the image set with an edge sensitive filter for preferentially reducing variations in the image set in regions outside those with edges to produce a filtered image set;

reverse Fourier transforming the filtered image set to producing a modified projection set; and combining the truncated projection set with the modified projection set to produce a composite projection set;

Fourier transforming the combined projection set to produce a second image set with reduced truncation artifacts.

8. The method of claim 7 wherein the filtering comprises;

processing the image set with a modified Sigma filter having horizontal window p, and vertical window $\Delta$ to produce a smoothed image set; and enhancing the edges of the smoothed image set.

9. The method of claim 8 wherein the value of $\Delta$ is varied to be proportional to the values of the first image set.

10. The method of claim 8 wherein the edge enhancing is done by raising the values of the first image set after processing by the modified Sigma filter, to a power.

11. The method of claim 7 wherein the splicing combines only the high frequency data elements of the modified projection set, with the data of the truncated projection set.

12. The method of claim 7 wherein the splicing includes the step of using a weighted average to blend the data between the truncated projection set and the modified projection set.

* * * * *